United States Patent
Ma et al.

(10) Patent No.: US 8,724,327 B2
(45) Date of Patent: May 13, 2014

(54) HEAT SINK ASSEMBLY

(75) Inventors: Xiao-Feng Ma, Shenzhen (CN); Lei Liu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/455,145

(22) Filed: Apr. 25, 2012

(65) Prior Publication Data

US 2013/0155623 A1 Jun. 20, 2013

(30) Foreign Application Priority Data

Dec. 14, 2011 (CN) .......................... 2011 1 0416921

(51) Int. Cl.
*H05K 7/20* (2006.01)

(52) U.S. Cl.
USPC .......................................... 361/719; 361/704

(58) Field of Classification Search
None
See application file for complete search history.

(56) References Cited

U.S. PATENT DOCUMENTS

| 4,593,342 | A  | * | 6/1986 | Lindsay ......................... | 361/720 |
| 6,568,464 | B1 | * | 5/2003 | He et al. ....................... | 165/80.3 |
| 7,239,518 | B2 | * | 7/2007 | Yang et al. .................... | 361/704 |
| 7,345,880 | B2 | * | 3/2008 | Lo .................................. | 361/704 |
| 8,201,617 | B2 | * | 6/2012 | Ye et al. ........................ | 165/80.3 |
| 2003/0159819 | A1 | * | 8/2003 | Lee ................................ | 165/185 |
| 2011/0188208 | A1 | * | 8/2011 | Wu ................................ | 361/719 |

FOREIGN PATENT DOCUMENTS

TW 200820880 A 5/2008

* cited by examiner

*Primary Examiner* — Gregory Thompson
(74) *Attorney, Agent, or Firm* — Novak Druce Connolly Bove + Quigg LLP

(57) ABSTRACT

A heat sink assembly includes a heat sink, two first fixing structures, and two second fixing structures. The heat sink includes a base. The base includes two opposite sidewalls each forming a fixing portion. When the heat sink is mounted to a first motherboard, the first fixing structures are respectively and detachably connected to the fixing portions of the heat sink, and fix the heat sink to the first motherboard. When the heat sink is mounted to a second motherboard, the second fixing structures are detachably connected to fixing portions of the heat sink, and fix the heat sink to the second motherboard.

9 Claims, 6 Drawing Sheets

HEAT SINK ASSEMBLY

BACKGROUND

1. Technical Field

The present disclosure relates to a heat sink assembly.

2. Description of Related Art

A conventional heat sink is mounted to a motherboard only by a predetermined fixing structure. To be mounted to different motherboards, the heat sink and the fixing structure must be accordingly modified, which is inconvenient and adds to the cost.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
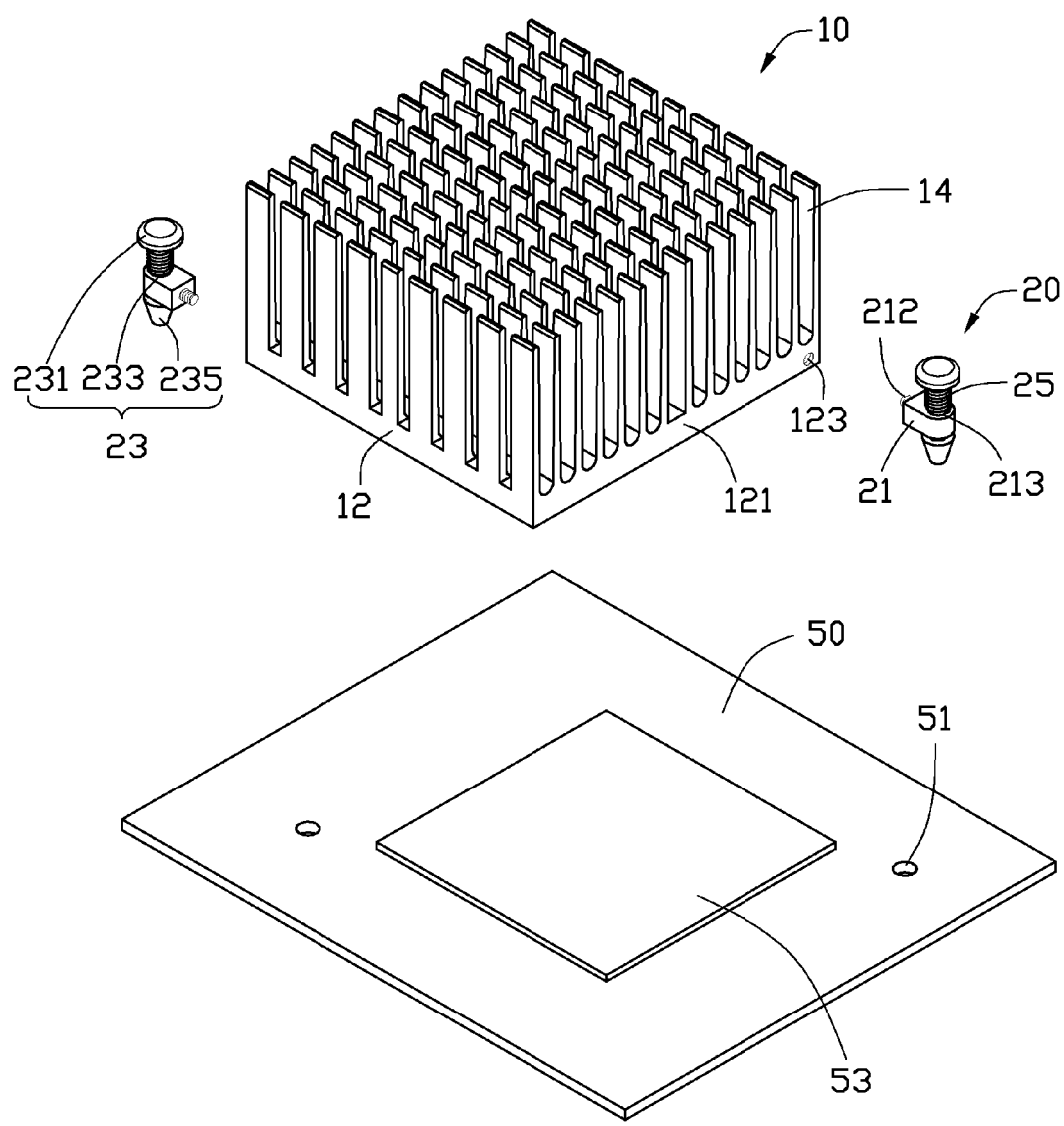
FIG. 1 is an exploded, isometric view of a first embodiment of a heat sink assembly together with a first motherboard.
Figure 3:
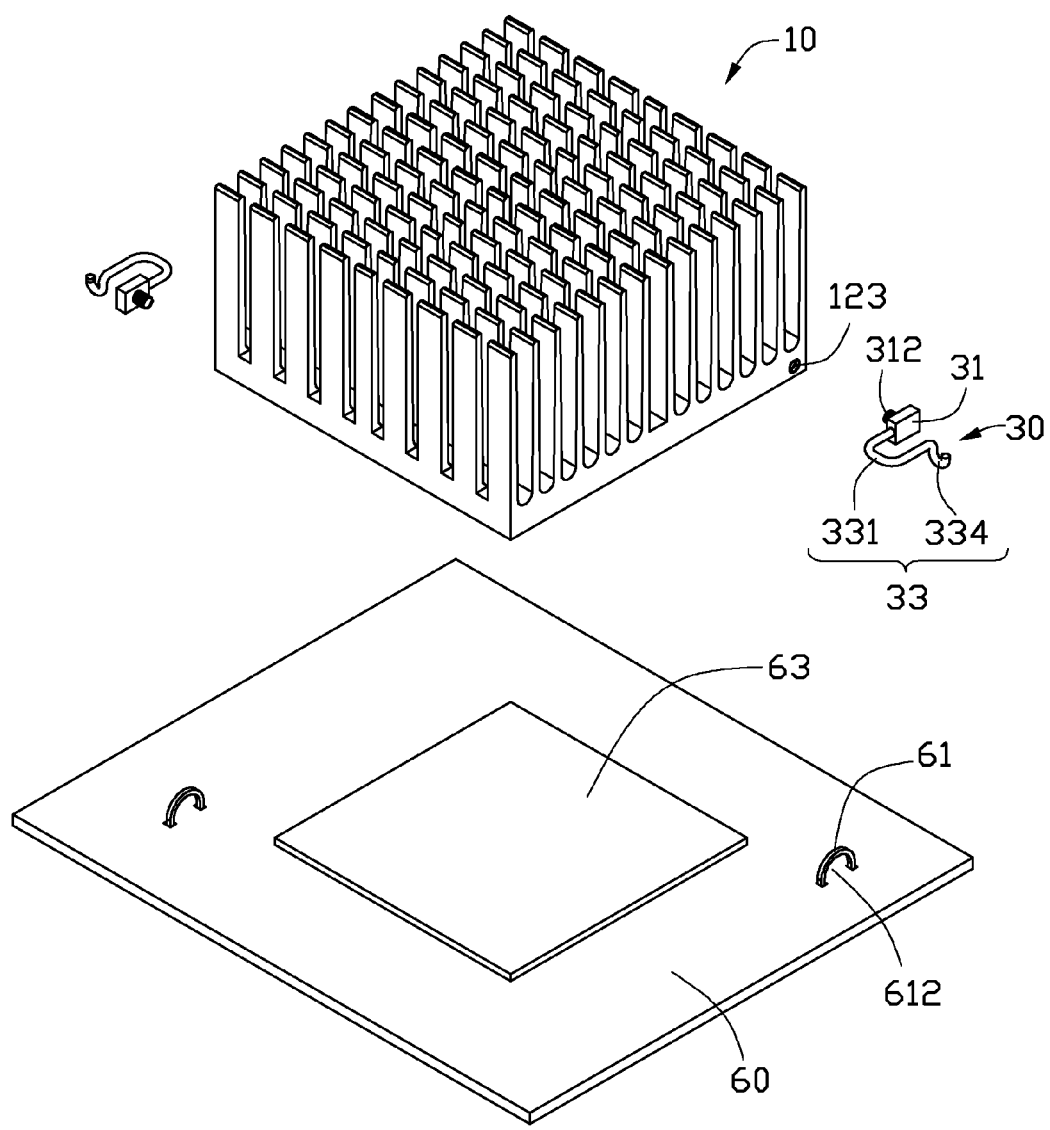
FIG. 3 is an exploded, isometric view of a second embodiment of a heat sink assembly together with a second motherboard.
Figure 5:
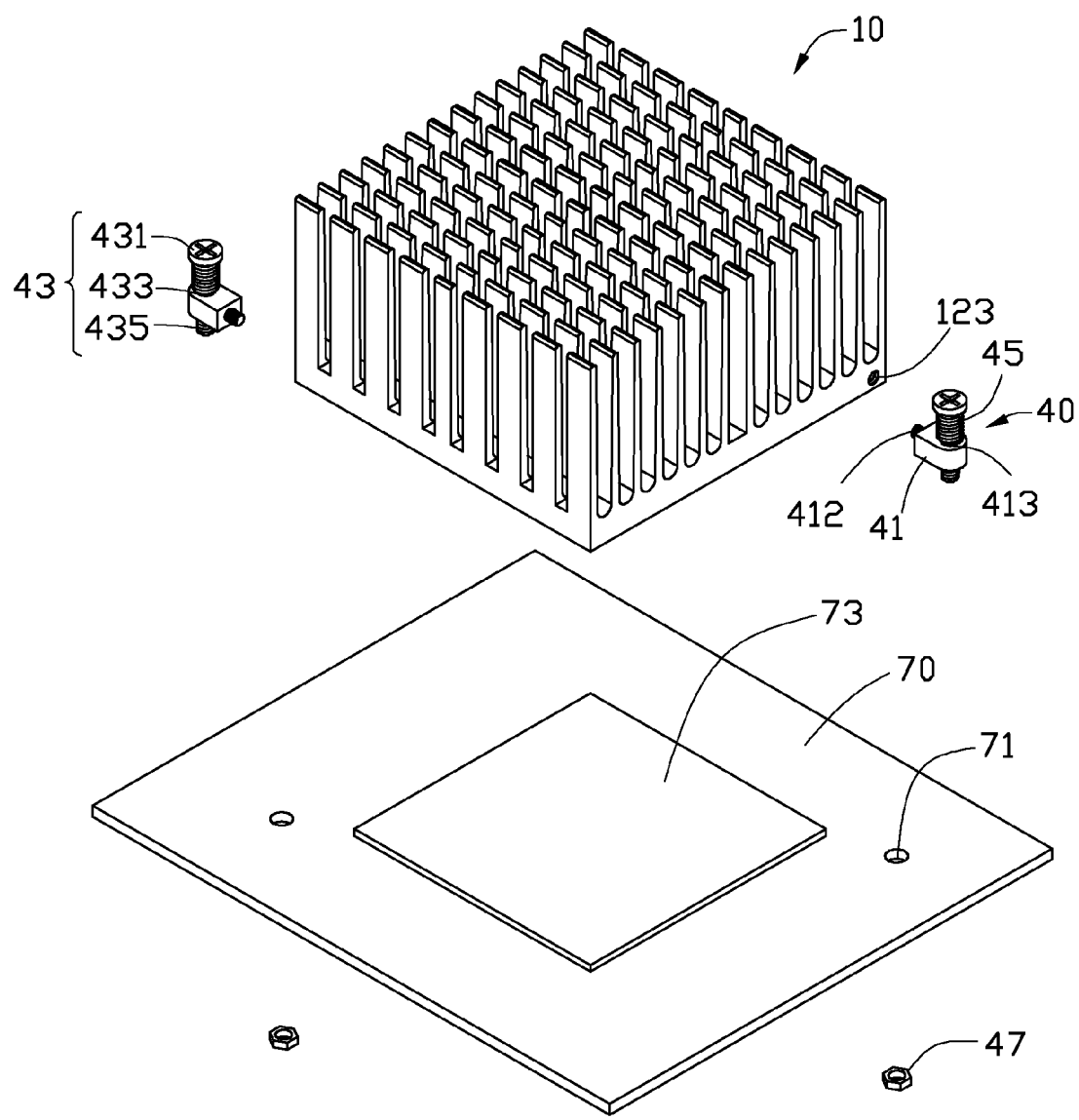
FIG. 5 is an exploded, isometric view of a third embodiment of a heat sink assembly together with a third motherboard.

FIGS. 1, 3 and 5, show an exemplary embodiment of a heat sink assembly for a first motherboard 50, a second motherboard 60, and a third motherboard 70. The heat sink assembly includes a heat sink 10, two first fixing structures 20, two second fixing structures 30, and two third fixing structures 40.

The heat sink 10 includes a rectangular base 12 and a plurality of fins 14 formed on the base 12. The base 12 includes two opposite sidewalls 121. A fixing portion is formed on each sidewall 121. In the embodiment, the fixing portion is a threaded hole 123, and the threaded holes 123 are respectively and diagonally defined in opposite ends of the sidewalls 121.

Each first fixing structure 20 includes a first block 21, a first fixing member 23, and a spring 25. A threaded shaft 212 protrudes from an end of the first block 21. A through hole 213 is defined in the first block 21 away from the threaded shaft 212, extending through the top and the bottom of the first block 21. The first fixing member 23 is a fastener, and includes a head 231, a pole 233 extending down from a middle of the bottom of the head 231, and a resilient hook 235 protruding from the bottom of the pole 233. The hook 235 is deformed to extend through the spring 25 and the through hole 213, and then is restored to engage with the bottom of the first block 21. The spring 25 is placed around the pole 233 and sandwiched between the head 231 and the first block 21.

Each second fixing structure 30 includes a second block 31 and a second fixing member 33. A threaded shaft 312 protrudes from an end of the second block 31. The second fixing member 33 is a latch bent by a metal rod and protruding from a lateral side of the second block 31 adjoining the end of the second block 31 having the threaded shaft 312. The second fixing member 33 includes a substantially U-shaped horizontal bent portion 331. An end of the bent portion 331 is connected to the second block 31. A substantially U-shaped top opened latching portion 334 extends down from a distal end of the bent portion 331.

Each third fixing structure 40 includes a third block 41, a third fixing member 43, a spring 45, and a nut 47. A threaded shaft 412 protrudes from an end of the third block 41. A through hole 413 is defined in the third block 41 away from the threaded shaft 412, extending through the top and the bottom of the third block 41. The third fixing member 43 is a fastener, and includes a head 431, a pole 433 extending down from a middle of the bottom of the head 431, and a threaded portion 435 formed on the bottom of the pole 433. The threaded portion 435 extends through the spring 45 and the through hole 413, and engages in the nut 47. The spring 45 is placed around the pole 433 and sandwiched between the head 431 and the third block 41.

An electronic component 53 is mounted on the first motherboard 50, and two first mounting portions are formed on the first motherboard 50 beside opposite corners of the electronic component 53. The first mounting portions are holes 51.

An electronic component 63 is mounted on the second motherboard 60, and two second mounting portions are formed on the second motherboard 60 beside opposite corners of the electronic component 63. The second mounting portions are bridge-shaped locking portions 61. A slot 612 is bounded by each locking portion 61 and the motherboard 60.

An electronic component 73 is mounted on the third motherboard 70, and two third mounting portions are formed on the third motherboard 70 beside opposite corners of the electronic component 73. The third mounting portions are holes 71.

Figure 2:
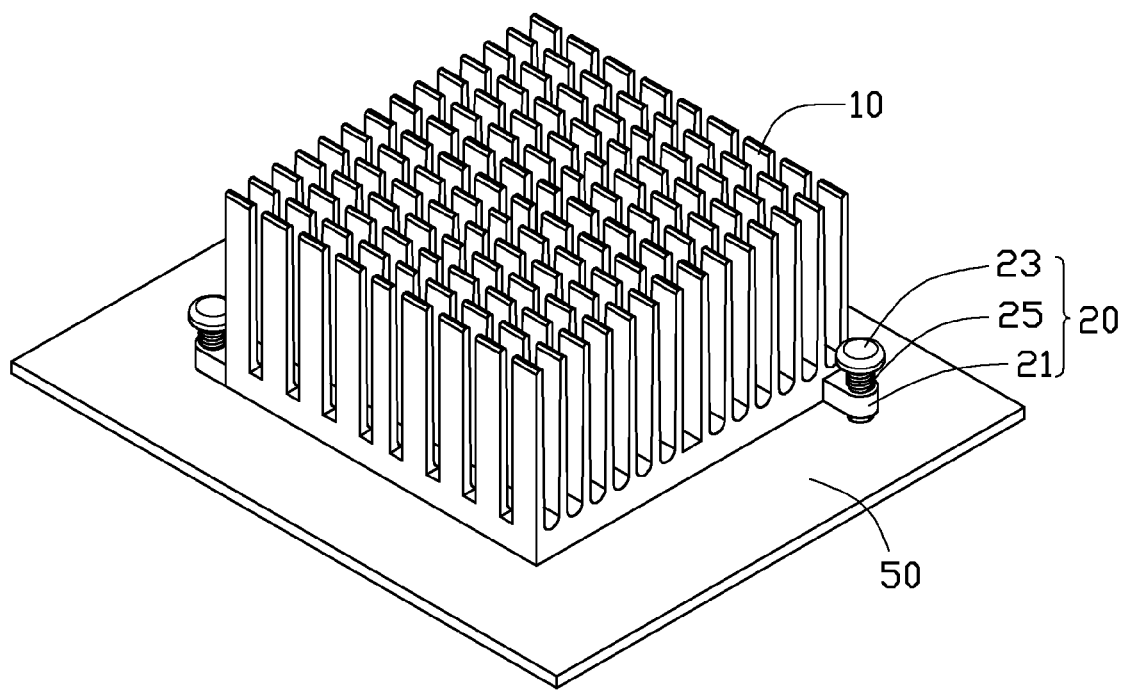
FIG. 2 is an assembled, isometric view of FIG. 1.

Referring to FIG. 2, in a first using embodiment, to mount the heat sink 10 to the first motherboard 50, the threaded shafts 212 are respectively engaged in the threaded holes 123. Thereby, the first fixing structures 20 are fixed to the heat sink 10. The hooks 235 are deformed to extend through the holes 51, and then are restored to engage with the bottom of the first motherboard 50. Thereby, the heat sink 10 is mounted to the first motherboard 50 by the first fixing structures 20. The top of the electronic component 53 contacts the bottom of the base 12.

Figure 4:
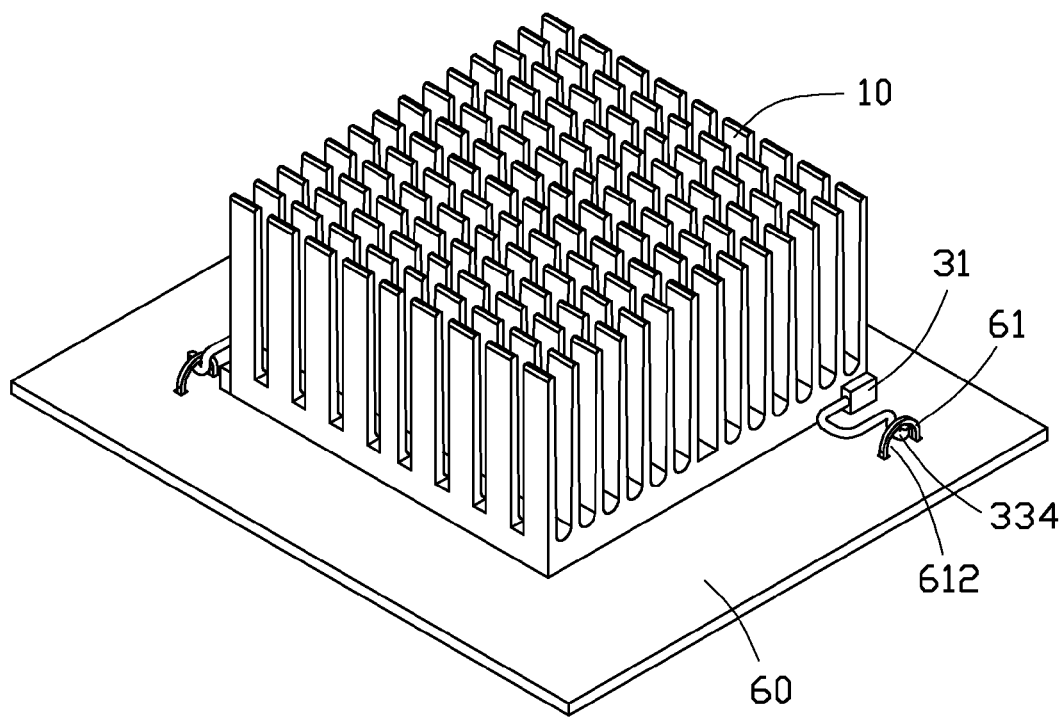
FIG. 4 is an assembled, isometric view of FIG. 3.

Referring to FIG. 4, in a second using embodiment, to mount the heat sink 10 to the second motherboard 60, the threaded shafts 312 are respectively engaged in the threaded holes 123. Thereby, the second fixing structures 30 are fixed to the heat sink 10. The latching portions 334 are extended through the slots 612 and engaged with the locking portions 61, to fix the heat sink 10 to the second motherboard 60. The top of the electronic component 63 contacts the bottom of the base 12.

Figure 6:
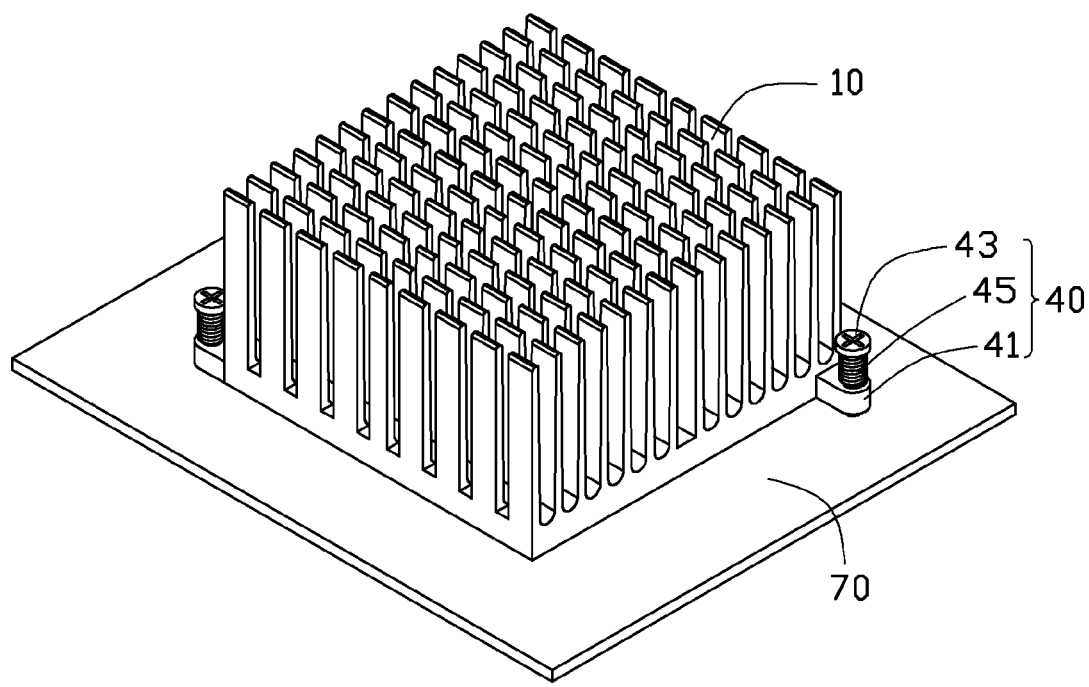
FIG. 6 is an assembled, isometric view of FIG. 5.

Referring to FIG. 6, in a third using embodiment, to mount the heat sink 10 to the third motherboard 70, the threaded shafts 412 are respectively engaged in the threaded holes 123. Thereby, the third fixing structures 40 are fixed to the heat sink 10. The nuts 47 are detached from the third fixing members 43. The threaded portions 435 are extended through the holes 71 and engaged in the nuts 47 again, to allow the nuts 47 to abut the bottom of the third motherboard 70. Thereby, the heat sink 10 is mounted to the third motherboard 70 by the third fixing structures 40. The top of the electronic component 73 contacts the bottom of the base 12.

Even though numerous characteristics and advantages of the embodiments have been set forth in the foregoing description, together with details of the structure and the functions of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A heat sink assembly, comprising:
   a heat sink comprising a base, the base comprising two opposite sidewalls each forming a fixing portion;
   two first fixing structures, wherein when the heat sink is mounted to a first motherboard, the two first fixing structures are respectively and detachably connected to the fixing portions of the heat sink, and fix the heat sink to the first motherboard; and
   two second substantially different fixing structures, wherein when the heat sink is mounted to a second motherboard, the two second fixing structures are respectively and detachably connected to the fixing portions of the heat sink, and fix the heat sink to the second motherboard.

2. The heat sink assembly of claim 1, wherein the fixing portions are threaded holes, each of the first and second fixing structures comprises a threaded shaft, to engage in a corresponding one of the threaded holes.

3. The heat sink assembly of claim 2, wherein each of the first fixing structures further comprises a first block connected to the corresponding threaded shaft, a through hole defined in the first block, and a fastener extended through the through hole for engaging with the first motherboard.

4. The heat sink assembly of claim 3, wherein each fastener comprises a head, a pole extending down from a middle of a bottom of the head, and a resilient hook protruding from a bottom of the pole, the hook extends through the through hole of the corresponding first block, for extending through the first motherboard and engaging with a bottom of the first motherboard.

5. The heat sink assembly of claim 4, wherein a spring is placed around each pole and sandwiched between the corresponding head and the first block.

6. The heat sink assembly of claim 3, wherein each fastener comprises a head, a pole extending down from a middle of a bottom of the head, and a threaded portion formed on a bottom of the pole, the threaded portion extends through the through hole of the corresponding first block and the first motherboard to engage with a nut.

7. The heat sink assembly of claim 6, wherein a spring is placed around each pole and sandwiched between the corresponding head and the first block.

8. The heat sink assembly of claim 3, wherein each of the second fixing structures further comprises a second block connected to the corresponding threaded shaft, and a latch connected to the second block for engage with the second motherboard.

9. The heat sink assembly of claim 8, wherein the latch is bent by a metal rod, and comprises a substantially U-shaped bent portion connected to the second block, and a substantially U-shaped top opened latching portion extending down from a distal end of the bent portion.

\* \* \* \* \*